(12) United States Patent
Chiou et al.

(10) Patent No.: US 6,376,382 B1
(45) Date of Patent: Apr. 23, 2002

(54) METHOD FOR FORMING AN OPENING

(75) Inventors: Jung-Chao Chiou, Hsinchu; Hsiao-Pang Chou, Taipei Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/224,071

(22) Filed: Dec. 30, 1998

(51) Int. Cl.$^7$ .............................................. H01L 21/311
(52) U.S. Cl. ....................................... 438/696; 438/740
(58) Field of Search .............................. 216/37, 39, 67, 216/17–19; 438/694–696, 700, 723–725, 595, 692, 706, 712, 715, 719, 734

(56) References Cited

U.S. PATENT DOCUMENTS

| | | | | |
|---|---|---|---|---|
| 4,855,017 A | * | 8/1989 | Douglas ..................... | 438/695 |
| 5,116,460 A | * | 5/1992 | Bukhman ................... | 438/696 |
| 5,474,651 A | * | 12/1995 | Huebner .................... | 438/631 |
| 5,817,579 A | * | 10/1998 | Ko et al. .................... | 438/740 |
| 5,907,775 A | * | 5/1999 | Tseng ........................ | 438/261 |
| 5,948,701 A | * | 9/1999 | Chooi et al. ................ | 438/694 |
| 6,025,259 A | * | 2/2000 | Yu et al. .................... | 438/618 |
| 6,083,844 A | * | 7/2000 | Bui-Le et al. .............. | 438/720 |

* cited by examiner

Primary Examiner—Gregory Mills
Assistant Examiner—Rudy Zervigon

(57) ABSTRACT

A method for forming an opening is provided. The method contains forming a dielectric layer on the substrate. The dielectric layer is patterned to form a first-stage opening. A carbonic-polymer (C-polymer) concentration controlling treatment is performed to obtain a proper C-polymer concentration, which can be raised, reduced, or even down to a zero concentration. After the proper C-polymer concentration is obtained, a next-stage opening is formed by another step of etching. The C-polymer concentration controlling treatment and the etching process with a new condition for each step can be repeated until a desired opening is formed.

18 Claims, 3 Drawing Sheets

METHOD FOR FORMING AN OPENING

BACKGROUND OF THE INVENTION

1. Field of the Invention

This invention relates to semiconductor fabrication, and more particularly to a method for forming an opening with a controlled concentration of carbonic polymer on an inner surface of the opening.

2. Description of Related Art

It has been a long history to etch dielectric oxide using fluorocarbon. Even now, fluorocarbon is still widely used. In order to obtain a desired etching profile in a complicate structure, it is necessary to includes several fluorocarbon etching steps. However, multiple etching steps may cause an interaction between fluorocarbon recipes used in different etching steps. It causes a difficulty to properly control the concentration of the fluorocarbon recipes. The complexity of etching does therefore increase.

For example, a conventional method to form a vertical-profile opening in a slanted-profile opening usually forms the slanted-profile opening first, and then directly forms the vertical-profile opening in the slanted-profile opening. It is usually done by changing the etchant. However, this manner cannot form a vertical-profile opening with a desired quality since a residual carbonic polymer from a previous etching process on each slanted sidewall of the slanted-profile opening may affect the performance of the anisotropic etching. An ideal vertical-profile opening cannot be obtained.

For an another conventional example, a dielectric layer including multiple sublayers, such as a stacked dielectric layer, usually needs several etching steps to completely etch through the dielectric layer. It is very impossible to obtain a desired performance by just changing the etching process. That is because a carbonic polymer residue from a previous etching process still remains at each sidewall of a previous opening and at the bottom area of the previous opening. The carbonic polymer residue may behave like an etching stop point stop point, and causes a stop of the whole etching process even though it has not finished yet.

Moreover, as the etching process is continuously performed until an etching stop layer is met, the etching process may damage the device structure by etching through the etching stop layer due to a too small thickness of the etching stop layer or a too fast etching rate.

SUMMARY OF THE INVENTION

It is therefore an objective of the present invention to provide a method for forming a opening by controlling a carbonic polymer concentration so as to prevent the conventional issues. An opening with a desired opening profile is ideally obtained.

It is another an objective of the present invention to provide a method, suitable for a multi-step etching process, to avoid an affection of subsequent etching performance from a carbonic polymer residue on an inner surface of an intermediate opening.

It is still another an objective of the present invention to provide an auxiliary etching stop method by controlling the carbonic polymer concentration to slow down the etching rate when the etching process is reaching an etching stop layer. The etching process is therefore ensured to stop at the etching stop layer.

In accordance with the foregoing and other objectives of the present invention, an improved method for forming an opening is provided. The improved method includes forming at least one dielectric layer on the substrate. The dielectric layer is patterned by, for instance, photolithography and etching to form a first-stage opening. A carbonic-polymer (C-polymer) concentration controlling treatment is performed to obtain a proper C-polymer concentration, which can be raised, reduced, or even down to a zero concentration. When the C-polymer concentration is raised, the etching rate is reduced. After the proper C-polymer concentration is obtained, a next-stage opening is formed by another step of etching. The C-polymer concentration controlling treatment and the etching process with a new condition for each step can be repeated until a desired opening is formed.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

The invention provides a method to form an opening by controlling carbonic-polymer (C-polymer) concentration so that an opening with a desired opening profile can be obtained. The method is particularly suitable for a multiple-stage opening. In order to have better descriptions, three examples are presented here for detail descriptions.

EXAMPLE 1

Figure 1A:
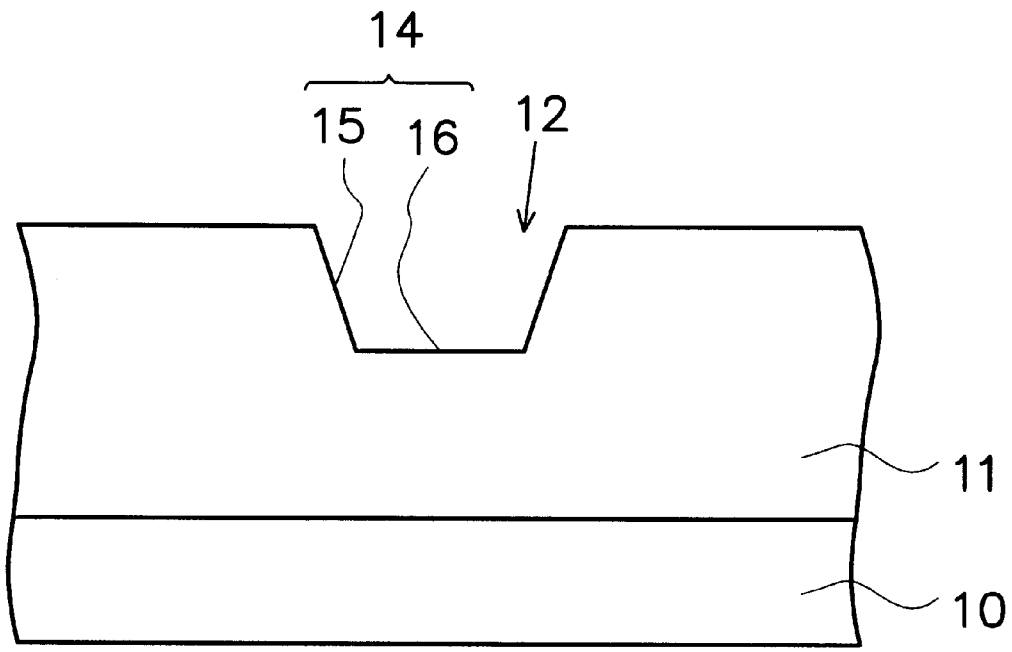
FIG. 1A and FIG. 1B are cross-sectional views of a portion of a substrate, schematically illustration a fabrication process of an multiple-stage open, according to a first preferred embodiment of the invention.
Figure 1B:
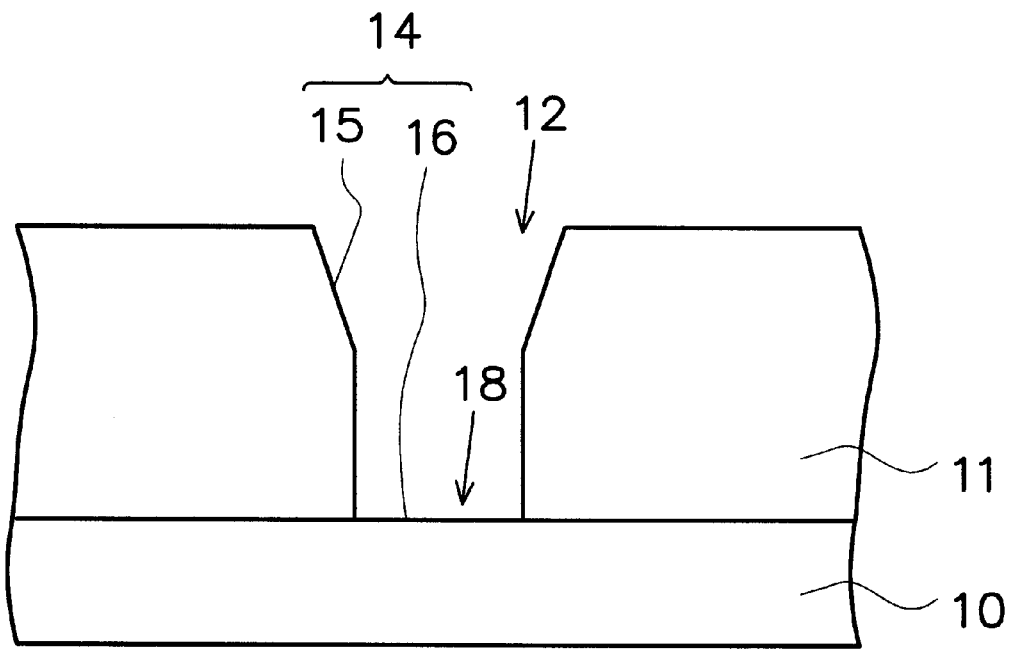

FIG. 1A and FIG. 1B are cross-sectional views of a portion of a substrate, schematically illustration a fabrication process of an multiple-stage open, according to a first preferred embodiment of the invention. In FIG. 1A, a dielectric layer 11 including, for example, silicon nitride or silicon oxide ($SiO_x$) is formed on a substrate 10 preferably by chemical vapor deposition (CVD), in which silicon nitride or the silicon nitride can be further doped. The silicon oxide ($SiO_x$) has a range of "X" about 1–2, and a range of 1.5–2 is preferred.

A first-stage opening 12 is formed in the dielectric layer 11. The opening 12, for example, has a profile with slant sidewall, or called a taper-type opening. The formation of the opening 12 includes photolithography and etching. The etching process, also or called a first-step etching process, includes an etchant, such as $CH_2F_2/O_2$, $C_4F_8/O_2$, or $CHF_3/CO$. The opening 12 includes a sidewall 15 and a bottom area 16, both of which form an opening inner surface 14 for the opening 12. The sidewall 15 is not only specified in a slant sidewall but slant sidewall is helpful for a step coverage performance.

During a transition period before a second-step etching process being performed, a C-polymer concentration controlling treatment is performed to obtain a proper C-polymer concentration on the opening inner surface 14. This the main characteristic of the invention. The C-polymer concentration controlling treatment includes, for example, adding the etchant with oxygen gas so as to reduce or even remove the C-polymer concentration on the opening inner surface 14. This provides a soft clean effect on the opening inner surface 14. Usually, the C-polymer concentration at the bottom area 16 has a more reducing effect than that at the sidewall 15. The purpose of the C-polymer concentration controlling treatment is to reduce or remove the C-polymer. It can also be achieved by using an etchant with low carbon content, such as $CF_4/O_2$, $CF_4$/noble-gas, $CHF_3/O_2$, $CHF_3$/noble-gas, $CH_2F_2/O2$, or $CH_2F_2$/noble-gas but with a lower carbon content. The C-polymer concentration controlling treatment behaves like a reset to initialize the opening inner surface 14 so that a subsequent etching process is not affected by this current etching process.

In FIG. 1B, a second-step etching process is performed to continuously form an opening 18 within the opening 12 until the substrate 10 is exposed. The second-step etching process includes an etchant, such as a mix gas of $C_4F_8$, noble gas, and oxygen. The opening 18 preferably has a vertical profile, which is not to be absolutely necessary. Since the C-polymer concentration at the sidewall 15 is greater that at the bottom area 16 of FIG. 1A, a portion of the dielectric layer 11 below the bottom area 16 is etched with a much faster etching rate than that on the sidewall 15.

In this example of the invention, a combined opening profile from the openings 12, 18 shown in FIG. 1B is obtained by simply controlling the C-polymer concentration on the sidewall 15 and the bottom area 16. There is no need of an extra fabrication process. The fabrication cost is not increased.

EXAMPLE 2

Figure 2A:
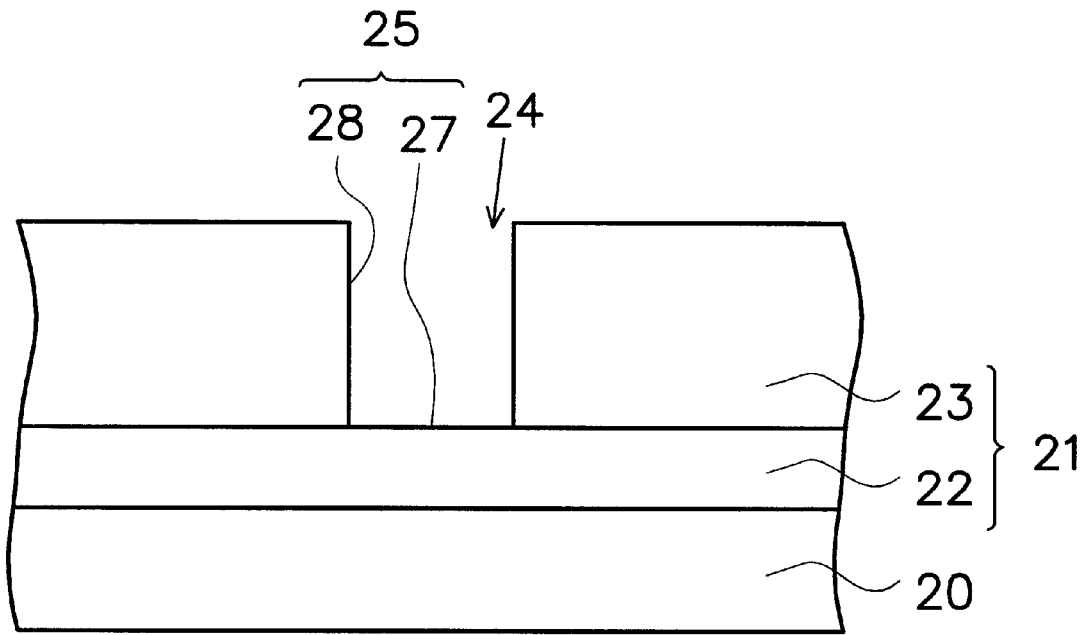
FIG. 2A and FIG. 2B are cross-sectional views of a portion of a substrate, schematically illustration a fabrication process of an multiple-stage open, according to a second preferred embodiment of the invention.
Figure 2B:
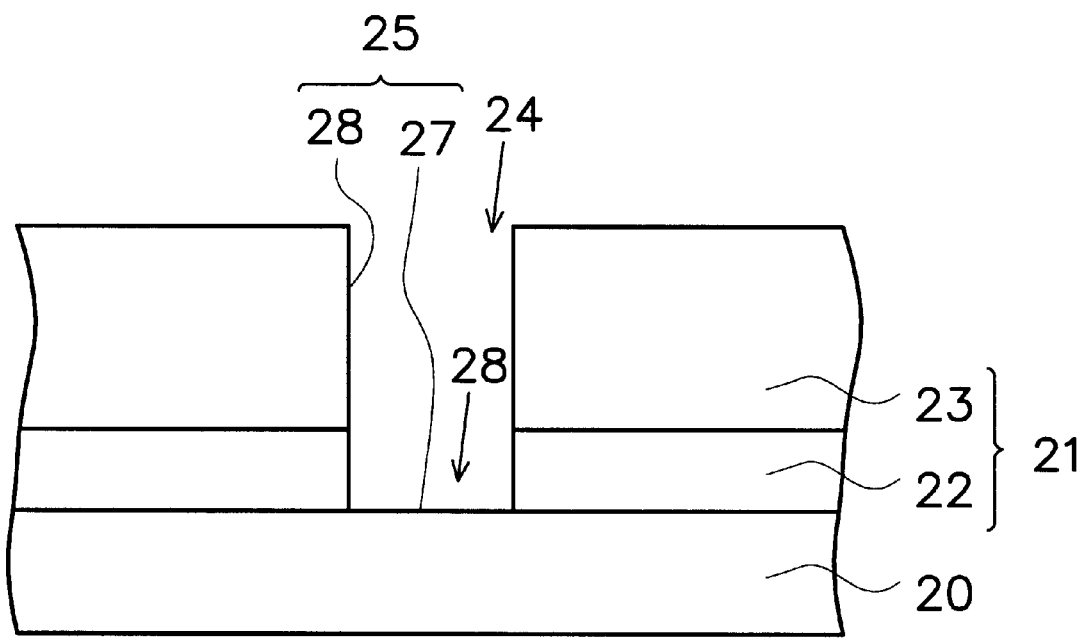

FIG. 2A and FIG. 2B are cross-sectional views of a portion of a substrate, schematically illustration a fabrication process of an multiple-stage open, according to a second preferred embodiment of the invention. In FIG. 2A, a multilevel dielectric layer 21 is formed on a substrate 20 by, for example, CVD. The multilevel dielectric layer 21 includes, for example, a dielectric layer 22 and a dielectric layer 23 with different materials, which are, for example, any two of silicon nitride, doped silicon nitride, silicon oxide ($SiO_x$) or doped silicon oxide ($SiO_x$), in which "X" has a range of about 1–2, and a preferred range of about 1.5–2.

A first-stage opening 24 is formed in the dielectric layer 23 to expose the dielectric layer 22. The formation of the opening 24 includes, for instance, photolithography and etching. The etching process, or also called a first-step etching process, includes an etchant, such as $CH_2F_2/O$, $C_4F_8/O_2$, or $CHF_3/CO$. The opening 24 includes a sidewall 26 and a bottom area 27, both of which form an opening inner surface 25.

Similarly, during a transition period before a second-step etching process being performed, a C-polymer concentration controlling treatment is performed to obtain a proper C-polymer concentration on the opening inner surface 25 of the opening 24. For example, the etchant is added with oxygen gas so as to reduce or even remove the C-polymer concentration on the opening inner surface 25. This provides a soft clean effect on the opening inner surface 25. As a result of the invention, the C-polymer concentration at the bottom area 27 has a more reducing effect than that at the sidewall 26. The purpose of the C-polymer concentration controlling treatment is to reduce or remove the C-polymer. It can also be achieved by, for example, using an etchant, such as $CF_4/O_2$, $CF_4$/noble-gas, $CHF_3/O_2$, $CHF_3$/noble-gas, $CH_2F_2/O2$, or $CH_2F_2$/noble-gas but with low carbon content. The C-polymer concentration controlling treatment behaves like a reset to initialize the opening inner surface 25 so that a subsequent etching process is not affected by this current etching process.

In FIG. 2B, a second-step etching process is performed to continuously form an opening 28 in the dielectric layer 22 within the opening 24 until the substrate 20 is exposed. The second-step etching process includes an etchant, such as a mix gas of $C_4F_8$, noble gas, and oxygen.

In this example 2, the multilevel dielectric layer 21 can include more than dielectric two layers, which are stacked up. In this manner, an opening to expose the substrate 20 can be formed by as several steps as desired. At each transition period between two different steps of etching, the C-polymer concentration controlling treatment is performed to reset a surface to be etched.

An improved opening profile is obtained by simply adjusting the etchant content to control the C-polymer concentration on the surface to be etched during each transition period. There is no need of extra fabrication processes. The fabrication cost is not increased.

EXAMPLE 3

Figure 3A:
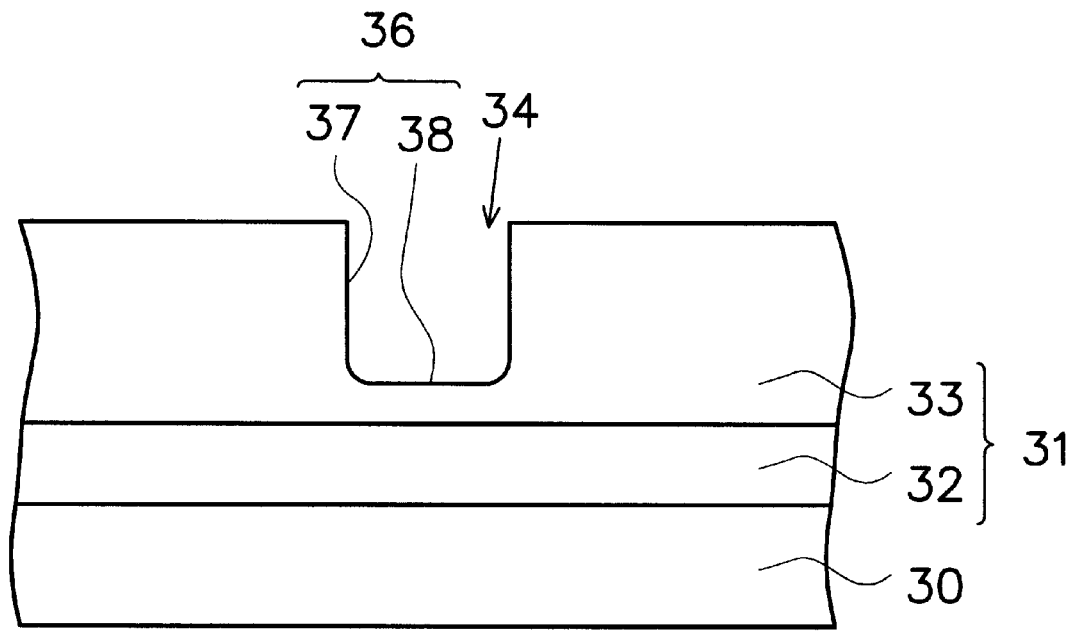
FIG. 3A and FIG. 3B are cross-sectional views of a portion of a substrate, schematically illustration a fabrication process of an multiple-stage open, according to a third preferred embodiment of the invention.
Figure 3B:
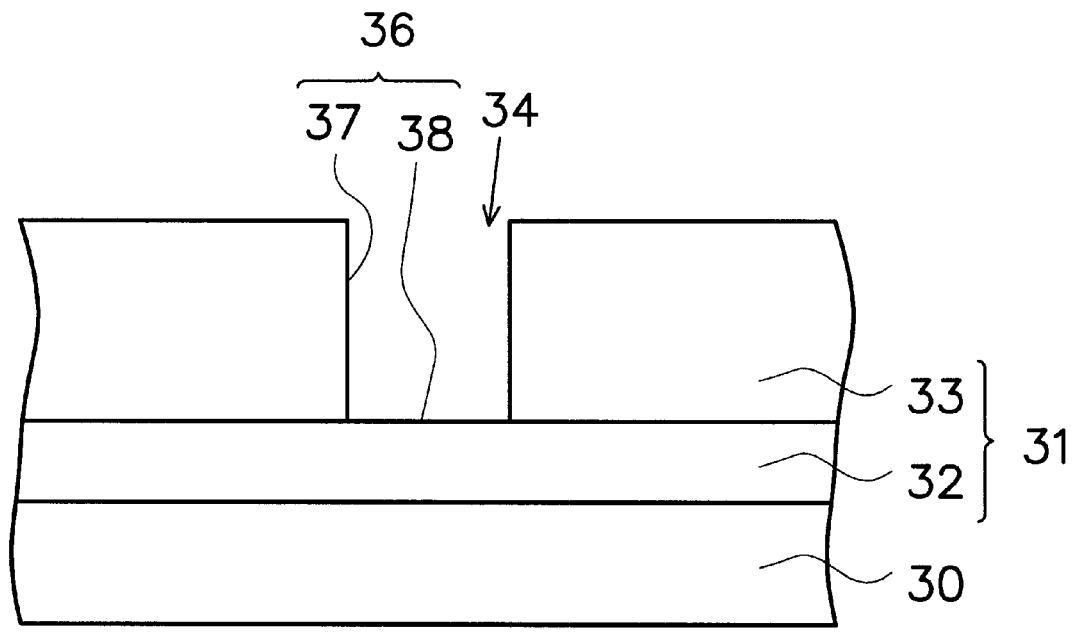

FIG. 3A and FIG. 3B are cross-sectional views of a portion of a substrate, schematically illustration a fabrication process of an multiple-stage open, according to a third preferred embodiment of the invention. In FIG. 3A, a multilevel dielectric layer 31 is formed on a substrate 30 by, for example, CVD. The multilevel dielectric layer 31 includes, for example, an etching stop layer 32 and a dielectric layer 33 with different materials, which are, for example, any two of silicon nitride, doped silicon nitride, silicon oxide ($SiO_x$) or doped silicon oxide ($SiO_x$), in which "X" has a range of about 1–2, and a preferred range of about 1.5–2.

An opening 34 is formed in the dielectric layer 33 but not yet to expose the etching stop layer 32. The formation of the opening 34 includes, for instance, photolithography and etching. The etching process, or also called a first-step etching process, includes an etchant, such as $CH_2F_2/O_2$, $C_4F_8/O_2$, or $CHF_3/CO$. The opening 34 includes a sidewall 37 and a bottom area 38, both of which form an opening inner surface 36.

As the bottom area 38 closes to the etching stop layer 32, in order to prevent the etching stop layer 32 from being etched through due to a too small thickness or a too fast etching rate, a C-polymer concentration controlling treatment is performed to slow down the etching rate. In this situation, the carbon content of the etchant is necessary to be properly increased so as to increase the C-polymer concentration on the opening inner surface 36. The purpose of this C-polymer concentration controlling treatment is to slow down the etching rate. It can be achieved by, for example, using an etchant, such as $CF_4/O_2$, $CF_4$/noble-gas, $CHF_3/O_2$, $CHF_3$/noble-gas, $CH_2F_2/O2$, or $CH_2F_2$/noble-gas but with a sufficient high carbon content.

In FIG. 3B, a second-step etching process is performed to continuously etch the dielectric layer 33 so as to just expose the etching top layer 32 without further overetching. The second-step etching process includes an etchant similar to the etchant used in the first-stage etching process, such as $CH_2F_2/O_2$, $C_4F_8/O_2$, or $CHF_3/CO$.

In conclusion of the above three examples, the invention perform the C-polymer concentration treatment at the transition period between two steps of etching process so as to either decrease the C-polymer concentration to reset the surface to be etched or increase the C-polymer concentration to slow down etching rate so as to avoid an overetching to the etching stop layer.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for forming an opening, the method comprising:

providing a substrate, which comprises a dielectric layer formed thereon;

patterning the dielectric layer to form a first opening without penetrating the dielectric layer, wherein a first-step etching process with a first etchant is used, and a first inner surface of the first opening comprises a first carbon-polymer (C-polymer) concentration;

performing a C-polymer concentration treatment to adjust the first C-polymer concentration into a second C-polymer concentration, which is less than the first C-polymer concentration, wherein the carbon-polymer remains at least on sidewall of the first opening after the C-polymer concentration treatment; and performing a second-step etching process on the first inner surface of the first opening with a second etchant to form a second opening within the first opening, in which the second opening exposes the substrate, wherein the etching rate of the first inner surface is controlled via the second C-polymer concentration adjusted by the C-polymer concentration treatment.

2. The method of claim 1, wherein the dielectric layer comprises silicon nitride, doped silicon nitride, silicon oxide ($SiO_x$), or doped $SiO_x$.

3. The method of claim 1, wherein the first etchant comprises $CH_2F_2/O_2$, $C_4F_8/O_2$, or $CHF_3/CO$.

4. The method of claim 1, wherein the step of performing the C-polymer concentration treatment comprises using an etchant, which includes $CF_4/O_2$, $CF_4$/noble-gas, $CHF_3/_2$, $CHF_3$/noble-gas, $CH_2F_2/O2$, or $CH_2F_2$/noble-gas.

5. The method of claim 1, wherein the step of performing the C-polymer concentration treatment comprises adding oxygen into the first etchant.

6. The method of claim 1, wherein the second etchant comprises $C_4F_8$, noble gas, and oxygen.

7. A method for forming an opening, the method comprising:

providing a substrate, which comprises a multilevel dielectric layer formed thereon, wherein the multilevel dielectric layer comprises at least a first dielectric layer formed on the substrate and a second dielectric layer formed on the first dielectric layer;

patterning the second dielectric layer to form a first opening, wherein a first-step etching process with a first etchant is used, and a first inner surface of the first opening comprises a first carbon-polymer (C-polymer) concentration;

performing a C-polymer concentration treatment to adjust the first C-polymer concentration into a second C-polymer concentration, which is less than the first C-polymer concentration, wherein the carbon-polymer remains at least on sidewall of the first opening after the C-polymer concentration treatment; and performing a second-step etching process on the first inner surface of the first opening with a second etchant to form a second opening in the first dielectric layer within the first opening, in which the second opening exposes the substrate, wherein the etching rate of the first inner surface is controlled via the second C-polymer concentration adjusted by the C-polymer concentration treatment.

8. The method of claim 7, wherein the first and the second dielectric layers comprise silicon nitride, doped silicon nitride, silicon oxide ($SiO_x$), or doped $SiO_x$.

9. The method of claim 7, wherein the first etchant comprises $CH_2F_2/O_2$, $C_4F_8/O_2$, or $CHF_3/CO$.

10. The method of claim 7, wherein the step of performing the C-polymer concentration treatment comprises using an etchant, which includes $CF_4/O_2$, $CF_4$/noble-gas, $CHF_3/O_2$, $CHF_3$/noble-gas, $CH_2F_2/O2$, or $CH_2F_2$/noble-gas.

11. The method of claim 7, wherein the step of performing the C-polymer concentration treatment comprises adding oxygen into the first etchant.

12. The method of claim 7, wherein the second etchant comprises $C_4F_8$, noble gas, and oxygen.

13. A method for forming an opening, the method comprising:

providing a substrate, which comprises an etching stop layer and a dielectric layer sequentially formed thereon;

patterning the dielectric layer to form a first-stage opening without exposing the etching stop layer, wherein a first-step etching process with a first etchant is used, and a first inner surface of the first-stage opening comprises a first carbon-polymer (C-polymer) concentration greater than zero which is formed without changing conditions of the first-step etching process;

performing a C-polymer concentration treatment to adjust the first C-polymer concentration into a second C-polymer concentration, which is greater than the first C-polymer concentration, wherein the carbon-polymer concentration on a side wall of the first opening is higher than that on a bottom of the opening after the C-polymer concentration treatment, and wherein the carbon-polymer concentration on the bottom of the opening is higher than zero; and performing a second-step etching process with a second etchant to continuously etch the first inner surface of the first-stage opening in the dielectric layer to expose the etching stop layer, wherein the etching rate of the first inner surface is controlled via the second C-polymer concentration adjusted by the C-polymer concentration treatment.

14. The method of claim 13, wherein the first and the second dielectric layers comprise silicon nitride, doped silicon nitride, silicon oxide ($SiO_x$), or doped $SiO_x$.

15. The method of claim 13, wherein the first etchant comprises $CH_2F_2/O_2$, $C_4F_8/O_2$, or $CHF_3/CO$.

16. The method of claim 7, wherein the step of performing the C-polymer concentration treatment comprises using an etchant, which includes $CF_4/O_2$, $CF_4$/noble-gas, $CHF_3/O_2$, $CHF_3$/noble-gas, $CH_2F_2/O2$, or $CH_2F_2$/noble-gas.

17. The method of claim 13, wherein the second etchant comprises $CH_2F_2/O_2$, $C_4F_8/O_2$, or $CHF_3/CO$.

18. The method of claim 1, wherein the step of performing the C-polymer concentration treatment results in a C-polymer concentration on a side wall of the first opening which is higher than that on a bottom of the first opening.

* * * * *